United States Patent [19]

Franaszek et al.

[11] Patent Number: 5,635,931
[45] Date of Patent: Jun. 3, 1997

[54] SYSTEM AND METHOD FOR COMPRESSING DATA INFORMATION

[75] Inventors: Peter A. Franaszek, Mount Kisco; Joy A. Thomas, White Plains; Pantelis G. Tsoucas, Mount Kisco, all of N.Y.

[73] Assignee: International Business Machines Corporation, Armonk, N.Y.

[21] Appl. No.: 253,047

[22] Filed: Jun. 2, 1994

[51] Int. Cl.$^6$ .................................................. H03M 7/30
[52] U.S. Cl. ............................ 341/51; 341/106; 341/107
[58] Field of Search ................................ 341/50, 51, 67, 341/106, 107; 382/239, 244

[56] References Cited

U.S. PATENT DOCUMENTS

| | | |
|---|---|---|
| 4,464,650 | 8/1984 | Eastman et al. . |
| 4,558,302 | 12/1985 | Welch . |
| 4,814,746 | 3/1989 | Miller et al. . |
| 4,843,389 | 6/1989 | Lisle et al. ............................ 341/106 |
| 4,876,541 | 10/1989 | Storer . |
| 5,254,990 | 10/1993 | Yoshida et al. ......................... 341/51 |
| 5,373,290 | 12/1994 | Lempel et al. .......................... 341/51 |
| 5,384,568 | 1/1995 | Grinberg et al. ....................... 341/51 |

OTHER PUBLICATIONS

Meir Feder, et al. "Universal Prediction of Individual Sequences," *IEEE Transactions on Information Theory*, vol. 38, No. 4, Jul. 1992, pp. 1258–1270.

Jorma Rissanen. "Complexity of Strings in the Class of Markov Sources," *IEEE Transactions on Information Theory*, vol. IT–32, No. 4, Jul. 1986, pp. 526–532.

Jacob Ziv, et al. "Compression of Individual Sequences via Variable–Rate Coding," *IEEE Transactions on Information Theory*, vol. IT–24, No. 5, Sep. 1978, pp. 530–536.

Eli Plotnik, et al. "Upper Bounds on the Probability of Sequences Emitted by Finite–State Sources and on the Redundancy of the Lempel–Ziv Algorithm," *IEEE Transactions on Information Theory*, vol. 38, No. 1, Jan. 1992, pp. 66–72.

Leo Breiman, et al. *Classification and Regression Trees.* Wadsworth & Brooks/Cole Advanced Books & Software, 1984, pp. 284–287.

*Primary Examiner*—Jeffrey A. Gaffin
*Assistant Examiner*—Jason L. W. Kost
*Attorney, Agent, or Firm*—Jenkens & Gilchrist

[57] ABSTRACT

A system and method for compressing or predicting data information received within an input stream, wherein contextual information is utilized in the selection of dictionaries for encoding or predicting of a next phrase within the information stream. The present invention utilizes contextual information in conjunction with dictionary-based Lempel-Ziv compression processes.

17 Claims, 8 Drawing Sheets

SYSTEM AND METHOD FOR COMPRESSING DATA INFORMATION

TECHNICAL FIELD OF THE INVENTION

This invention relates in general to data processing systems and, more specifically, to a system and method for compressing data.

BACKGROUND OF THE INVENTION

The information age is upon us and, more and more, computers are absorbing the workload of gathering, storing, and manipulating this information. A problem arises since various forms of information require significant amounts of data storage, which is a resource that is often expensive and/or scarce. Further, the transmission of a great amount of information, or data, often requires a considerable amount of time, even at the high data transfer rates available with current data processing systems.

As a result, data compression is a valuable tool for conserving memory and accelerating the data transfer process. However, data compression techniques need to be lossless (without incidences of error or loss of data), except for applications pertaining to graphic images or digitized voice. Lossless compression consists of those techniques guaranteed to generate an exact duplicate of the input data stream after a compress/expand cycle. This is the type of compression often used when storing database records, spreadsheets, or word processing files. In these applications, the loss of even a single bit can be catastrophic.

In general, data compression consists of taking a stream of symbols and transforming them into codes. If the compression is effective, the resulting stream of codes will be smaller than the original symbol stream. The decision to output a certain code for a certain symbol or set of symbols is based on a model. The model is simply a collection of data and rules used to process input symbols and determine which code(s) to output. A program uses the model to accurately define the probabilities for each symbol in order to produce an appropriate code based on those probabilities.

Data compression enters into the field of information theory (information theory is a branch of mathematics that concerns itself with various questions about information, including different ways of storing and communicating messages) because of its concern with redundancy. Redundant information in a message takes extra bits to encode, and if this extra information can be removed, the size of the message may be reduced.

Information theory uses the word "entropy" as a measure of how much information is encoded in a message. The higher the entropy of a message, the more information it contains. The entropy of a symbol is defined as the average of the negative logarithm of its probability. To determine the information content of a message in bits, entropy is expressed using the base 2 logarithm:

Number of bits=−Log base 2 (probability).

The entropy of an entire message is simply the sum of the entropy of all individual symbols.

Entropy fits with data compression in its determination of how many bits of information are actually present in a message. If the probability of a character "e" appearing in this document is 1/16, for example, and the information content of the character is 4 bits, then the character string "eeeee" has a total content of 20 bits. If standard 8-bit ASCII characters are used to encode this message, then 40-bits are actually used. The difference between the 20-bits of entropy and the 40-bits used to encode the message is where the potential for data compression arises.

Using an automotive metaphor for data compression, coding would be the wheels, but modeling would be the engine. Regardless of the efficiency of the coder, if it does not have a model feeding it good probabilities, it will not compress data.

Lossless data compression is generally implemented using one of two different types of modeling: statistical or dictionary-based. Statistical modeling reads in and encodes a single symbol at a time using the probability of that character's appearance. Statistical models achieve compression by encoding symbols into bit strings that use fewer bits than the original symbols. The quality of the compression goes up or down depending on how good the program is at developing a model. The model has to predict the correct probabilities for the symbols. The farther these probabilities are from a uniform distribution, the more compression that can be achieved.

Dictionary-based modeling uses a single code to replace strings of symbols. In dictionary-based modeling, the coding problem is reduced in significance, making the model supremely important. The dictionary-based compression processes use a completely different method to compress data. This family of processes does not encode single symbols as variable-length bit strings; it encodes variable-length strings of symbols as single pointers. The pointers form an index to a phrase dictionary. If the pointers are smaller than the phrases they replace, compression occurs. In many respects, dictionary-based compression is easier for people to understand. In every day life, people use phone numbers, Dewey Decimal numbers, and postal codes to encode larger strings of text. This is essentially what a dictionary-based encoder does.

In general, dictionary-based compression replaces phrases with pointers. If the number of bits in the pointer is less than the number of bits in the phrase, compression will occur. However, the methods for building and maintaining a dictionary are varied.

A static dictionary is built up before compression occurs, and it does not change while the data is being compressed. For example, a database containing all motor-vehicle registrations for a state could use a static dictionary with only a few thousand entries that concentrate on words such as "Ford," "Jones," and "1994." Once this dictionary is compiled, it is used by both the encoder and the decoder as required.

There are advantages and disadvantages to static dictionaries. Nevertheless, dictionary-based compression schemes using static dictionaries are mostly ad hoc, implementation dependent, and not general purpose.

Most well-known dictionary-based processes are adaptive. Instead of having a completely defined dictionary when compression begins, adaptive schemes start out either with no dictionary or with a default baseline dictionary. As compression proceeds, the processes add new phrases to be used later as encoded tokens.

For a further discussion of data compression in general, please refer to *The Data Compression Book*, by Mark Nelson, © 1992 by M&T Publishing, Inc., which is hereby incorporated by reference herein.

As mentioned, the history of past symbols of a sequence often provides valuable information about the behavior of the sequence in the future. Various universal techniques have been devised to use this information for data compression or prediction. For example, the Lempel-Ziv ("LZ") compression process, which is discussed within *Compression of individual Sequences by Variable Rate Coding*, by J. Ziv and A. Lempel, IEEE Trans. Inform. Theory, IT-24:530–536, 1978 (which is incorporated by reference herein), uses the past symbols to build up a dictionary of phrases and compresses the string using this dictionary. As Lempel and Ziv have shown, this process is universally optimal in that the compression ratio converges to the entropy for all stationary ergodic (of or related to a process in which every sequence or sizeable sample is equally representative of the whole) sequences. Thus, given an arbitrarily long sequence, such compression operates as well as if the distribution of the sequence was known in advance.

The Lempel-Ziv compression method has achieved great popularity because of its simplicity and ease of implementation (actually, Lempel-Ziv is often used to denote any dictionary based universal coding scheme, as a result, the standard method described herein is only one of this large class). It asymptotically achieves the entropy limit for data compression. However, the rate of convergence may be slow and there is scope for improvement for short sequences. In particular, at the end of each phrase, the process returns to the root of the phrase tree, so that contextual information is lost. One approach to this problem was suggested by Plotnik, Weinberger and Ziv for finite state sources, as described within *Upper Bounds on the Probability of Sequences Emitted by Finite-State Sources and on the Redundancy of the Lempel-Ziv Algorithm*, by E. Plotnik, M. J. Weinberger and J. Ziv, IEEE Trans. Inform. Theory, IT-38(1): 66–72, January 1992, which is incorporated by reference herein. Their idea was to maintain separate LZ like trees for each source state (or estimated state) of a finite state model of the source. Plotnik, Weinberger and Ziv showed that this procedure is asymptotically optimal.

However, Plotnik, Weinberger and Ziv did not provide any procedure for finding the set of trees to use for the compression. They assumed that the state machine description of the source is available to both the encoder and decoder, and that the state of the machine is known by both parties. However, in general, one does not know the state machine description of the source. Additionally, even if one knew the state description of the source, using separate dictionaries for every state could perform worse than a common dictionary compression scheme if the number of states is very large.

Thus, there is a need in the art for an improved data compression technique implemented within a data processing system which has a faster rate of convergence. There is a further need in the art for a data compression technique that is more effective for short sequences. And, there is a need in the art for an improved data compression technique that utilizes contextual information in achieving the compression of the data.

SUMMARY OF THE INVENTION

Accordingly, an object of the present invention is to provide an improved system and method for compressing information, which takes into account contextual information.

In attainment of the above object, contextual information is implemented in conjunction with a dictionary-based compression process within a data processing system. Before encoding a next phrase within an input string of data, the present invention, through dynamic programming, derives the statistically best set of dictionaries for utilization in encoding the next phrase. The selection of this set of dictionaries is dependent upon each dictionary's past utilization within the process. Thus, the choice of dictionaries is directly related to each of their performance on compression, and not on some presumed model for the sequence as is required in a compression technique utilizing a state machine description of the source, which is available to both the encoder and decoder.

This selected set of dictionaries is then implemented by the data processing system to encode the next phrase of data. The context of the phrase is used to select a particular dictionary within the selected set for the encoding process, which computes a pointer to the phrase within the dictionary that corresponds to the next phrase.

The decoder portion of the present invention, which may also be implemented within a data processing system, builds and maintains identical dictionaries to those developed by the encoder. This allows the decoder to use the pointer to point to the appropriate and corresponding phrase within its own dictionaries in order to reproduce the original phrase.

Additionally, after encoding of each phrase, the encoded phrase is utilized to extend (build) the dictionaries for subsequent use by the system and process of the present invention.

In an alternative embodiment, contextual information is utilized by a variation of the present invention to predict the next symbol within an input stream of information.

The methods, techniques, and data structures described here may be implemented by loading one or more sequences of program statements from a program storage device (e.g., a computer tape, a magnetic or optical disk storage device, or other storage means) into the memory or memories of a digital computer or computers configured as described herein and causing the computer(s) to execute program sequences as appropriate. The design and development of specific program sequences is a matter of routine work for persons of ordinary skill (which of course should include familiarity of the computer(s), operating system(s), etc., that are selected for the implementation) who have the benefit of this disclosure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

General

Figure 1:
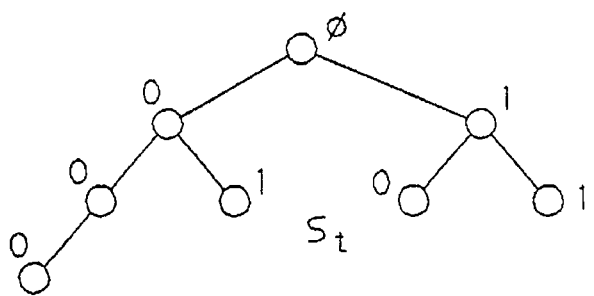
FIG. 1 illustrates a prior art dictionary tree for a particular data string.

The present invention for data compression implemented within a data processing system considers approaches based on multiple trees or dictionaries, with an emphasis on issues of tree selection and maintenance. The dictionaries used may comprise separate trees, or (as may be more advantageous) subtrees of a single tree. A tree or subtree is associated with each possible d-history, $d \leq D$, where a d-context or d-history h of a phrase is the set of d bits (or, symbols, in general) immediately preceding it and D is the maximum context considered. The tree or subtree to be used at a given time is determined by the above-mentioned allocation function, which is optimized via dynamic programming in a technique related to the optimal pruning of regression trees (please refer to *Classification and Regression Trees*, by L. Breiman, J. H. Friedman, R. A. Olshen and C. J. Stone, Wadsworth, Belmont, Calif., 1984, which is incorporated by reference herein).

To motivate this approach, the use of $2^{D+1}$ phrase trees is considered, one for each possible d-context (the remainder of this discussion will be with reference to a binary sequence, although one skilled in the art may make necessary modifications for any other sequence of symbols). Depending on the length of the string, each separate dictionary may be too small to offer good compression. In this case, if the phrases from another context are sufficiently similar, a larger dictionary corresponding to the combined context may be used. The set of combined contexts to be used (a partition of the context space) is determined by the above-mentioned allocation function to be further discussed below, which is optimized via an estimate of the expected compression.

Another application of the present invention is in the field of prediction, where the context allocation function may be optimized, for example, to minimize a measure associated within the actual performance of a predictor.

Multiple Trees and Context Dependence

Before beginning a description of a standard Lempel-Ziv compression process and its generalizations, definitions of some notations are required. Assume a binary sequence $x_1, x_2, \ldots$. This assumption is for simplicity; the results can easily be generalized to any finite alphabet.

A phrase or substring of the sequence is defined as a sequence of the form $x_i, x_{i+1}, \ldots x_j$, and will be denoted as $$x_i^j$$

A parsing of the sequence of length n is defined as a division of the sequence $$x_1^n$$

into non-overlapping phrases, separated by commas. A distinct parsing of the sequence is a parsing such that all phrases are distinct.

The standard Lempel-Ziv compression process is based on a parsing of the sequence into distinct phrases. Given that the string has been parsed to a particular point, the process looks along the sequence for the shortest phrase that has not been seen before. This phrase must have as a prefix one of the phrases seen earlier. Then to encode this phrase, a pointer is sent to the previous phrase and the last bit of the phrase. Using the previous phrase and the last bit, a decoder implemented within a data processing system can reconstruct the new phrase and thus decode the sequence up to the end of the new phrase.

To start the encoding, it is assumed that the initial phrase is the null phrase. For example, a string 0110011100000 will be parsed as 0,1,10,01,11,00,000. Then the encoded sequence is (represented as (pointer, last bit)) given by (0,0), (0,1), (2,0), (1,1), (2,1), (1,0), (6,0), where for simplicity, decimal numbers have been used for the pointer to the previous phrase. For short strings, the process does not appear to compress the string, but the surprising fact is that asymptotically, the process compresses any stationary ergodic sequence to its entropy rate.

An LZ compression process can be described more easily in terms of a tree. Let $S_t$ be the set of phrases seen until point t in the sequence. Since the occurrence of a phrase in the set $S_t$ implies that all its prefixes must also be in the set, this set can be described by the nodes of a binary tree. FIG. 1 illustrates a prior art binary sequence $S_t$ as a tree.

Let $T_t$ denote the binary tree describing the collection of phrases at time t defined in the usual way, i.e., each phrase corresponds to a node of the tree such that the path from the root of the tree is the sequence of symbols of the phrase. Then the Lempel-Ziv process can be described in terms of adding phrases to the tree.

The Lempel-Ziv (LZ) extension of a tree and the associated phrase for a sequence $$x_t^\infty$$

is defined as follows: traverse the maximal path of nodes $\eta_0, \ldots, \eta_k$ of the tree where $\eta_0 = \emptyset$ and, for $i=0, \ldots, k-1$, $\eta_{i+1}$ is the child of $\eta_i$ corresponding to $x_{t+i}$. By maximality, $\eta_k$ is an external node of T. The tree is then extended by adding node $\eta_{k+1}$ which is the child of $\eta_k$ corresponding to $x_{t+k}$. The phrase associated with this extension is $$x_t^{t+k}$$

Denote this transformation of T by $$LZ(T, x_t^\infty)$$

Thus the Lempel-Ziv tree is constructed by means of a series of Lempel-Ziv extensions starting with the empty tree and using the sequence $$x_1^\infty$$

The number of phrases seen until time n is equal to the number of nodes in the tree at time n. Let $c_n$ denote the number of phrases seen until time n. To describe one of these phrases requires a pointer to its prefix (at most $\lceil \log c_n \rceil$ bits), plus the new symbol (1 bit). Thus the total description length of the string until time n has length at most $c_n(\lceil \log c_n \rceil + 1)$. The asymptotic optimality of the Lempel-Ziv compression process is implied by the following theorem:

If $X_1, X_2, \ldots$ are drawn from a stationery ergodic process, then $$\lim_{n\to\infty} \sup \frac{c_n(\lceil \log c_n \rceil + 1)}{n} \leq H, \quad a.s. \tag{1}$$

where H is the entropy rate of the process.

The Lempel-Ziv process can be viewed as a means of developing an effective model of the source in terms of a probability distribution on the nodes of the process phrase tree it constructs. However, at the end of every phrase, the process returns to the root of the tree, losing any memory of the path it was following.

In principle, some path memory could be preserved by maintaining multiple trees, for example, one for each context of length D. Then if D were sufficiently large, and the sequence sufficiently long, it might be expected that the context dependent use of these multiple trees would capture a significant part of the information lost from returning to the root at the end of the phrase.

However, as discussed below, contexts of fixed length D may not be optimal. Thus, methods are hereinafter considered where the context is to be used (and the corresponding tree) is determined via an optimization procedure.

Figure 2:
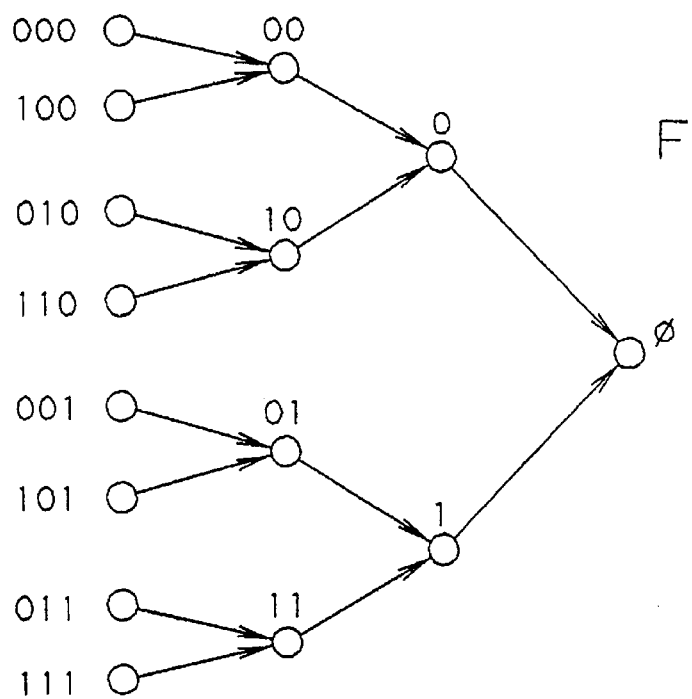
FIG. 2 illustrates a history tree having depth D=3.

Let H be a set of D-contexts. FIG. 2 illustrates a history tree H to depth D=3. History tree H is a representation of all contexts up to depth D=3. The set of possible histories of depth D=3 or less consists of $\{\emptyset, 0, 1, 00, 10, 01, 11, 000, 100, 010, 110, 001, 101, 011, 111\}$, where $\emptyset$ denotes the null string. A tree $T_H$ is formed of phrases seen in context H if (a) h∈H for the history h of each phrase in $T_H$, and (b) each phrase in $T_H$ was formed by an LZ extension to $T_H$.

Note that each subtree of a tree $T_H$ is itself a tree of phrases seen in some context H', when H' is the concatenation of H with the bit vector h, which reaches the root of $T_{H'}$ from the root of $T_H$.

Let $\{i\}_f$ be the indices of the points $x_i$ which are the first symbols of transmitted phrases. These points are hereinafter termed phrase points.

Note that a given phrase point might fit more than one context, say H and H'. Here the phrases added to $T_H$ and $T_{H'}$ may not be the same, as these correspond to LZ extensions of different trees.

To achieve compression using such context dependent multiple trees or subtrees, the sender (encoder) and receiver (decoder) need to agree on which tree to use. Thus the following is required:

1. At the end of every phrase, at time t, an allocation function $R_t$ is required, which chooses a particular tree from this set of trees causally based on the current state of the trees and the past samples from the sequence. This function is known to both the encoder and decoder, and since the decoder will have decoded the sequence until time t, it can also calculate the value of $R_t$ and therefore both encoder and decoder will know which tree will be used for encoding the next phrase.
2. A procedure is required for updating the trees as a function of time. The only property imposed on the updates is that every time a tree is used for encoding, the phrase that it encodes is added to that tree. Therefore the same phrase cannot be encoded twice using the same tree.

Suppose a compression process maintains a separate LZ phrase tree $T_H$ for phrases seen with context H. Then a particular phrase will not be repeated more than once per tree.

For an LZ process with K multiple trees or subtrees (K is a constant), where each transmitted phrase is repeated at most once per tree, let $c_n$ denote the total number of phrases transmitted up to time n. Then $$\lim_{n\to\infty} \sup \frac{c_n(\lceil \log c_n \rceil + 1)}{n} \leq H \quad a.s. \tag{2}$$

Context Allocation

Figure 3:
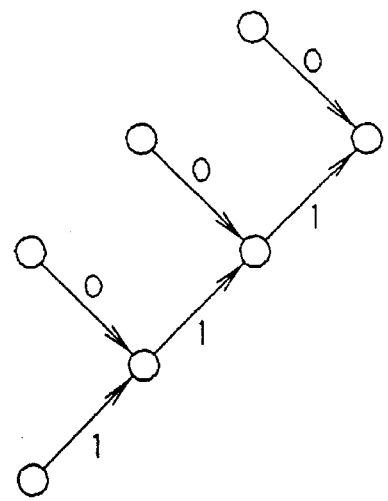
FIG. 3 illustrates a basis set.

The standard LZ compression process is a greedy procedure which chooses the longest previously seen matching phrase. The goal of the present invention is to, in addition, greedily choose a tree or subtree that provides the best estimated compression. However, the actual compression achieved depends on the sequence that follows and this needs to be estimated based only on the data shared by the receiver and the transmitter. Let B be a partition of the set of all D-contexts, and let $\{H_i\}$ be the members of B. That is, each D-context is included in one and only one member of B. B is referred to as a "spanning basis set," and corresponds to a complete subtree of the history tree. FIG. 3 illustrates a spanning basis tree of 3-context: $\{0, 01, 011, 111\}$. Let $T_H$ be a tree of phrases obtained in context H, and let $r_h$ be the empirical frequency of h for the transmitted phrases. Let $M(T_H)$ be an estimate of the expected compression over the next phrase, given that h∈H is the current D-context. Then $$V = \Sigma r_h M(T_{H(h)}) \tag{3}$$

Note that V would be the expected value for the compression obtained over the next phrase if $r_h$ were the actual probability of context h and $M_{(TH(h))}$ were the actual compression ratio, given H.

Equation (3) may be rewritten as $$V(B) = \sum_{H \in B} \frac{n_H}{n} M(T_H) \tag{4}$$

where $n_h$ is the observed count for context H, and n is the total number of phrases. The quantity $n_H/n$ is the empirical frequency of context H∈B. The estimates $M(T_H)$ are discussed below.

V(B) is a function of the partition or basis set B. The goal is to optimize this function. As noted above, it may sometimes pay to merge dictionaries associated with different contexts if the set of phrases seen in each context are sufficiently similar.

In general, the present invention might consider any partition of the context space and choose one that minimizes V(B). However, in the present application, storage and computational overheads required for considering all possible partitions might be prohibitive. The present discussion thus restricts itself to a subset of such partitions; though, with ample overhead, all possible partitions could be considered. In particular, it is assumed that the current d context h, for some value of d≤D is the appropriate form for H. Here, each H consists of those D-contexts which share a suffix of length d≤D. This corresponds to the leaves of what has been termed the complete suffix tree (please refer to *Complexity of Strings in the Class of Markov Sources*, by J. Risannen, IEEE Trans. Inform. Theory, IT-32:526–532, July 1986 which is incorporated by reference herein). More general basis sets, for example, ones with a tree structure more general than complete suffix trees (for non-binary sequences) might also be of interest. However, in the current application, another property of basis sets associated with the leaves of complete suffix trees is exploited, namely, that each member of B can be made to correspond to a subset of a tree structured dictionary, as will be further discussed below.

The structure of Equation 10 below corresponds generally to what is termed a classification or regression tree, a type of construct that has received extensive attention and application in the statistical and medical literature. The motivation is typically to provide a partition of the sample space which would have yielded the best classification when applied to the samples of a training set. Such classification or regression trees are pruned by various means so as to avoid overspecification of the model, that is, to avoid too fine a partition. The present application is somewhat different in that the optimization does not apply to a training set directly, but instead uses the observed sequence both in an estimate of the relative frequencies of the contexts and in constructing and estimating the performance to be obtained from sets of context dependent trees.

Let $\{B\}$ be the set of spanning basis sets to be considered Let $B^*$ be the spanning basis that minimizes Equation 10, i.e., $$V(B^*) = \min_{B} \sum_{h \in B} \frac{n_h}{n} M(T_h) \qquad (5)$$

This objective function is such that the optimization problem can be solved by dynamic programming. The present invention takes advantage of the tree structure of B; at each stage of the computation, the benefit of keeping a particular history (node in the history tree) in the basis is compared to the benefit of adding the two possible prefixes of this history (the two children of the corresponding node) to the basis. If $C(h)$ denotes the best weighted compression ratio over all histories in the subtree of the history tree rooted at history h, $C(h)$ is then calculated recursively as (where h is any history and $B_h = \{0h, 1h\}$ are the two possible prefixes to the history)

$$C(h) = \begin{bmatrix} M(T_h) & \text{if } h \text{ is of length } D \\ & \text{otherwise} \\ \min \left[ M(T_h), \frac{n_{0h}}{n_h} C(0h) + \frac{n_{1h}}{n_h} C(1h) \right] \end{bmatrix} \qquad (6)$$

Then $C(0) = V^*$, and the optimal basis set consists of those nodes that were chosen during the recursion as being better than their children.

The above is a procedure to optimize the basis set at any time, and thus an allocation rule R, that chooses a particular context at any time. In principle, $R_t$ could be recomputed at the beginning of each phrase. However, the phrase trees change only slowly, so that most of the benefit from the computation might be obtained by doing it only periodically.

Now consider the quantities $M(T_h)$, the estimated compression using tree $T_h$ for the next phrase with context h. One approach to estimating this compression is to simply keep track of the compression achieved for the last few phrases using this tree, and take the average of these samples as the estimate for $M(T_h)$. An alternative approach is suggested by the fact that since the Lempel-Ziv algorithm is asymptotically optimal, it can be shown that asymptotically, all the external nodes of the tree are about equally likely to be extended. Therefore, the average depth of the external nodes of the tree+1 is a good estimate of the average length of the phrases that will be formed by Lempel-Ziv extensions of the tree.

Let $T_h$ be the tree used to encode the next phrase. The length of the representation of the phrase is the length of the pointer to an external node (a node that could be extended) +1 bit for the extension. The pointer has a length $\lceil \log_2 |\epsilon(T_h)| \rceil$, where $\epsilon(T_h)$ is the set of external nodes of the tree $T_h$ and the $\lceil x \rceil$ is the smallest integer greater than or equal to x. Therefore, the resulting estimate for the compression is $$M(T_h) = \sum_{e \in \epsilon(T)} \frac{1}{|\epsilon(T)|} \frac{\lceil \log |\epsilon(T)| \rceil + 1}{l(e) + 1} \qquad (7)$$

where $l(e)$ is the length of the path from the root to external node e of tree $T_h$.

An estimate of the improvement to be gained by application of context allocation in compression is not easily available, as this would require an evaluation or bound on fairly complex expressions which are themselves only heuristic estimates. However, in order to provide some insight, a simple example is considered under simplifying assumptions.

Let $h_1$ and $h_2$ be two contexts and let h be the union of the two. Let $P_1$, $P_2$, and p denote the respective empirical frequencies, and let $P_1 = P_2$. Suppose that the trees $T_{h_1}$ and $T_{h_2}$, have $\overline{D}_1 = \overline{D}_2$ and that $\overline{D}_1 \sim \overline{D}$, as could happen if the two trees $T_{h_1}$ and $T_{h_2}$ are disjoint. Suppose further that $\lceil \log \epsilon_1 \rceil = \lceil \log \epsilon_2 \rceil = \lceil \log \epsilon \rceil - 1$. Then $$V_1 = \frac{\overline{D}_1 + 1}{\lceil \log \epsilon_1 \rceil + 1} = \frac{\overline{D} + 1}{\lceil \log \epsilon \rceil} \qquad (8)$$

and the benefit for adding one bit of context (in this artificial case) is a reduction of one bit transmitted per phrase. Applying this example recursively suggests that if the message length were say 10 bits, three bits of context in this rather unrealistic example could yield a thirty percent reduction in message length.

As discussed above, it is well recognized that there is a close relationship between compression and prediction. The above methodology may be applied to the prediction of say the next symbol $x_{t+1}$ of a binary sequence, given $x_1 \ldots x_t$. Suppose context h is used. Then a maximum likelihood estimator of the next symbol is simply $$Q_h(\hat{X}_{t+1}) = \begin{pmatrix} \max(N_h(0), N_h(1)) & \text{if } N_h(0) \neq N_h(1) \\ 0 \text{ or } 1 & \text{prob. } 1/2 \end{pmatrix} \qquad (9)$$

where $N_h(i)$ is the number of times that i has been seen in context h.

Using the above context allocation methodology, the context h may be chosen as the compatible component of the basis B which minimizes $$V(B) = \sum_{h \in B} \frac{n_h}{n} M_t(h) \qquad (10)$$

where $M_t(h)$ expresses some tradeoff between the amount of data gathered and the similarity of data among contexts. In the usual application of classification and regression trees, it is common to incorporate a penalty (often logarithmic) in the measure $M(\cdot)$ to prevent overspecification of the model. That is, coarse partitions with similar performance are favored over finer ones.

As in the case of compression, $M_t$, could be constructed to be a function of not just the cumulative statistics, but also of how they occur. For example, $M_t(h)$ could be a function of the number of correct vs. incorrect predictions that would have been made had context h been used up to time t. Alternatively, it might be noted that the estimated compression achieved using basis B has the appropriate form of clustering contexts with a common structure, and also incorporating a penalty for overspecification.

In the following, some further details are provided regarding the application of the context allocation process to the prediction of time series within a data processing system.

Consider a time series $x(i)$, $i=1, 2, 3, \ldots$ where $x(i)$ is known for each i not greater than t. Suppose it is desired to obtain an estimate of $x(t+T)$, subject to minimizing some cost function $C(e)$, where e is the prediction error. This is a problem that arises in many applications. Examples include estimation of future queue length, or the demand for, a service. There are a variety of approaches to such prediction problems. The prediction process is related to the compression process.

Let h denote a history of the sequence; that is, a set of sequence values immediately preceding the current time. These values might be simply the values of $x(t-i)$, $i=1, 1, \ldots d$, or they could be derived quantities such as the average change. A history tree is constructed whose nodes at depth d correspond to a set of proximate histories of length d, with d not larger than k. That is, a node representing history h of length d has as its predecessor in the tree a node which represents history h', of length d−1, which is a suffix to h.

Corresponding to each node in the tree, data is maintained for predicting the value of $x(t+T)$, given that the current history h corresponds to that node. Each time this history correspondence occurs, a predicted value is obtained (for example simply by using the average change over time T given this history), and, after time T, the error e in the prediction is calculated, and from this the cost $C(e)$. Let $AC(h)$ be the average of these costs associated with history h, and let $n(h)$ be the number of times that h arises (i.e. the number of times that $C(e)$ is computed for history h).

The dynamic programming method described above is then used to find an optimal basis set for prediction. This is a set of histories which partitions the history space, and corresponds to the leaves of a complete subtree of the history tree. The quantity minimized is the sum of $pb(h)*CA(h)$, where $pb(h)$ is the empirical frequency of history h, and $CA(h)$ is the average cost associated with this history. The minimized quantity is an estimate of the expected cost, using the set of history dependent predictions associated with the basis set.

Compression Processes

The issues of updating and maintenance of context dependent phrase trees or subtrees are now discussed. The form of the theorem mentioned above is such that phrases may be gathered either into separate trees, or into one tree with subtrees used as a function of context.

In the standard LZ compression process (also referred to herein as Process 1), phrases do not overlap, and all phrases are chosen from a single tree. Thus there is at most one update to be done to the tree at any time. In the case of multiple trees, the transmitted phrase chosen from some tree $T_h$ may be completed before the corresponding phrase (from say a larger tree with a compatible context) from $T_h$. The result may be the presence within a single tree of multiple uncompleted phrases.

At any time, at most one of the phrases will be actually used for compression, and a pointer to that phrase will be sent to the decoder. The other phrases are added to the tree so that the tree includes all phrases with that particular context. Thus, these other phrases to the tree are added in such a way that the decoder can do the same, and in the same order. This is achieved by means of constructions termed herein as tokens.

A token in a tree represents the current end of a phrase that has not yet been completed. As more bits of the sequence are encoded or decoded by the data processing system, the token moves further into the tree, until at one point it comes to an external node. At this point, the token is promoted to become a leaf of the tree, and then deleted from the list of tokens.

The decoder also maintains the list of tokens in the same way as the encoder, and also promotes the tokens at the same points. Since both the encoder and decoder deal with the tokens in the same order (in the order that they were added to the tree), they will always have the same state of the trees at the end of each phrase.

By use of the tokens, the present invention is able to add phrases to the stored tree that are not used as phrases in the encoding of the sequence. In two of the processes discussed below, D+1 tokens are added to the various tree/subtrees for each phrase of the encoding. Thus, many more nodes are added to the tree, and the trees grow faster than they would under standard LZ.

Alternatively, if the process uses as dictionaries subtrees of a single tree, the path marked by the token is that from the root of the subtree. As the common knowledge advances, tokens may move forward (i.e., deeper into the tree). When the token advances past an external node, it is promoted to form an LZ extension of $T_h$. If there are multiple tokens, they are moved forward in index order, i.e., earliest token first.

Process 2 discussed below maintains a separate tree for each d-context h, $d \leq D$. Process 3 below utilizes a single tree, maintained in a form which yields what we call a compound phrase tree. Both these processes conform to the theorem above, and experimental results indicate that they yield improved performance over standard LZ. However, both have higher storage requirements than standard LZ.

In order to consider a process with storage requirements similar to standard LZ, Process 4 is also discussed below. This uses a tree essentially identical to that of Process 1, with subtrees utilized as dictionaries.

Process 2: Multiple Trees

Process 2 is an alternative embodiment of the present invention, which is discussed previous to Process 3, a preferred embodiment of the present invention, for the sake of clarity in the discussion.

A separate tree $T_h$ is maintained for each d-context h, $d \leq D$. This is in contrast to the method suggested in *Upper Bounds on the Probability of A Sequence Emitted by Finite-State Sources and on the Redundancy of the Lempe-Ziv Algorithm*, by E. Plotnik, M. J. Weinberger, and J. Ziv, IEEE Trans. Inform. Theory, IT-38(1):66–72, January 1992, which is hereby incorporated by reference herein, where separate trees are maintained for each "state" of an assumed or estimated finite state model for the sequence. In the following approach, since it is not assumed that there is knowledge of a finite state model, these trees are maintained for all possible "states" or order less than D.

At t=0, and subsequently at t=t(n), the end of each phrase $$X_{t(n-1)+1}^{t(n)}$$

a d context h is chosen via the allocation method discussed above. The identity of the longest compatible phrase from $T_h$ is transmitted, plus an extension. For each history q compatible with (i.e., which is a suffix of) the D-context at t(n), a phrase is started by $T_q$ by adding a token to the root of $T_q$.

Note that a phrase, if transmitted in context h, is added to $T_h$. Thus the process conforms to the theorem above, and is asymptotically optimal. The Tree $T_\phi$ associated with the empty context, corresponds to that in Process 1, in that if the allocation function always decides on the empty context, the two processes produce identical performance. Each new phrase in Process 2 results (after tokens are promoted) in the addition of a node in each of D+1 trees, so that the storage requirements are greater than that of Process 1.

Figure 4:
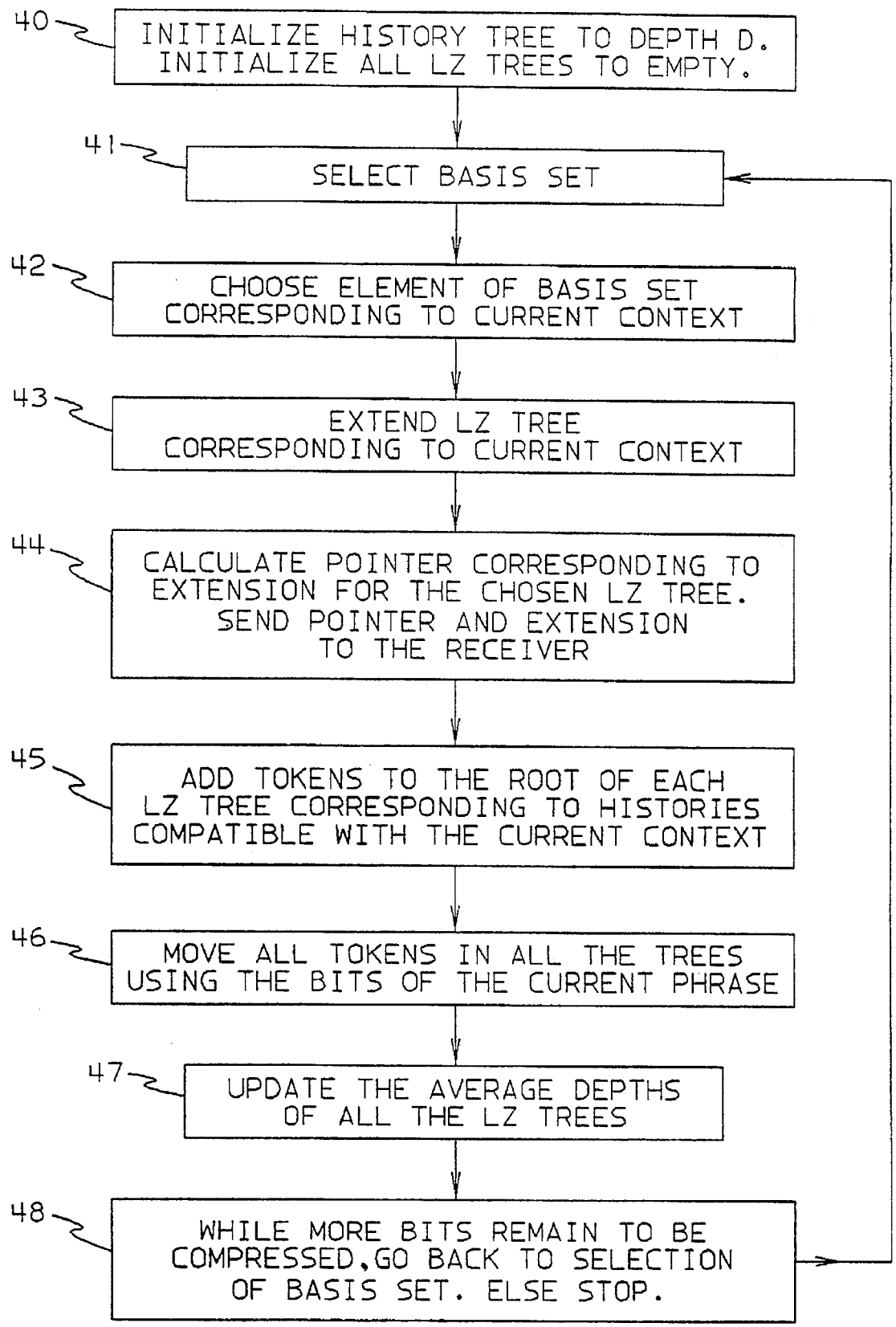
FIG. 4 illustrates a flow diagram of an alternative embodiment of the present invention.

Referring next to FIG. 4, there is illustrated a flow diagram of an implementation of Process 2. Process 2 begins at step 40, wherein the history tree is initialized to depth D and all LZ trees are initialized to empty. Thereafter, at step 41, the optimal basis set (having the lowest compression ratio) is selected, as previously described, in order to achieve the statistically best compression possible. If compression is first being implemented with respect to a string, the null basis set may be selected for the first compression. Alternatively, when the compression ratios for all basis sets are equal, the smallest basis set may be selected.

Next, at step 42, the element within the selected basis set corresponding to the current context of the next data string to be compressed is chosen. Thereafter, at step 43, the phrase being compressed, or encoded, is used to extend the LZ tree corresponding to the current context. Next, at step 44, a pointer corresponding to an extension for the chosen LZ tree is calculated. This pointer and extension are also sent to the receiver, or decoder, as is further described below.

Next, at step 45, tokens are added to the root node of each LZ tree that corresponds to the histories compatible with the current context. Subsequently, at step 46, all tokens in all trees are moved using the bits of the current phrase being compressed. Thereafter, at step 47, the average depths of all the LZ trees are updated for subsequent use in step 41. Then, at step 48, if more bits, or phrases, remain to be compressed, Process 2 returns to step 41, otherwise Process 2 ends.

As an example, consider the sample input string comprising the following bits:
01011001010001000100010010001111101010101101000 101110.

In this example, D=1; therefore, there are three trees: the null set and a tree with a context of "0" and a tree with a context of "1."

Figure 9A:
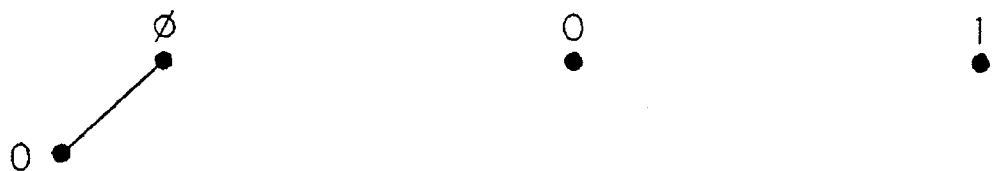
FIGS. 9a–f illustrate the growth of various context-dependent dictionaries during an implementation of Process 2.

The first string within the input, which has not been seen before is the bit "0". Therefore, bit "0" is first to be compressed. As discussed above, the selection of the basis set for compression may be chosen at this time to be the default selection of the null basis set, or, alternatively, the smallest basis set may be chosen at this time, which again is the null basis set. FIG. 9a illustrates the construction of the three trees, or dictionaries, as directed within step 43 of FIG. 4. As directed within step 44, a pointer to the null context tree is calculated along with the extension illustrated in FIG. 9a for transmission to the decoder. Since this first bit "0" did not have a context, no other trees need to be extended at this time. Correspondingly, the use of tokens is not required at this time.

Note that the average depth of each tree is now calculated as directed within step 47 above. The average depth of the null set is 0.500, while the pointer length required to encode the illustrated extension within the null basis set is of length 1. Thereafter, the compression ratio is computed.

The compression ratio may be computed as the pointer length required to point to the next bit to be encoded within the tree divided by the average depth of the tree after the next bit is placed within the tree. For example, the compression ratio for the null tree within FIG. 9a will be computed as the pointer length plus 1 bit divided by the average depth plus 1 bit which corresponds to (1+1)/(0.500+1)=1.333.

For the other two trees within FIG. 9a, the pointer length and the average depth are both 0. Therefore, the compression ratio computed for both of these trees will be equal to 1 (i.e., (0+1)/(0+1)). Thereafter, the compression ratios are weighted (since there are separate trees for the two contexts within the basis set) before comparison for selection of the next basis set to encode the next string of bits. Since the null set consists of only 1 tree, no weighting is necessary. However, the basis set {0,1} consists of 2 trees, a weighting of its computed compression ratios is required. This weighting is equal to the compression ratio computed for each tree (i.e., the "0" context tree and the "1" context tree) multiplied by the number of nodes within that particular tree divided by the total nodes within the basis set. For example, if the "0" context tree has grown to 10 nodes and the "1" context tree has grown to 20 nodes (thus, there are a total of 30 nodes within the basis set), then the compression ratio computed for the "0" context tree will be multiplied by 10/30, while the compression ratio computed for the "1" context tree will be multiplied by 20/30. Then, these two values will be added to come up with the weighted compression ratio for the basis set {0,1}.

In the above example illustrated with respect to FIG. 9a, the weighted compression ratio for the basis set {0,1} is equal to (0)1.000+(0)1.000=0. In this case, though 0 is less than 1.333 the process is configured to choose the tree having an actual compression ratio; in this case, the null basis set is selected for the next compression.

Figure 9B:
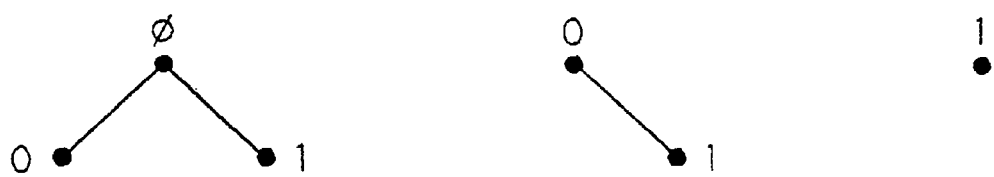

As a result, the null basis set, i.e., the null context tree, will be utilized for the next compression. Therefore, the above input string is again evaluated for the next string of bits, taking into account that the null basis set will be utilized for compression. The next bit within the string is a "1", which has not been seen before with respect to the null context set. Therefore, this "1" bit will be compressed using the null basis set. Referring next to FIG. 9b, it may be viewed that the null tree has been grown as illustrated, as directed within step 43. Thereafter, a pointer to the null tree along with the extension to the "1" bit is computed and transmitted as the encoded version of the "1" bit.

Thereafter, all trees having a compatible context with the encoded "1" bit are also extended. As a result, the "0" context tree is grown as illustrated in FIG. 9b, since the recently encoded "1" bit had a context of a "0" bit (D=1). Note that the "1" context tree is not affected, as expected. Steps 45 and 46 within FIG. 4 are not required since tokens are not needed at this time.

Thereafter, the average depths of the three trees are computed. For the null tree, the average depth is computed by taking the total number of nodes within the tree that can be extended, which is computed by taking the sum of the pointer lengths of the nodes that may be extended within the tree and dividing that number by the total number of nodes that may be extended within the next cycle, which in the case of the null tree amounts to 2/2, which is equal to an average depth of 1.000. Note that the pointer length is equal to the number of bits required to distinguish the nodes within the tree. As a result, the compression ratio is equal to 2/2.000= 1.000.

Similar computations will result in an individual compression ratio for the "0" context tree, illustrated in FIG. 9b, equal to 1.333, while the compression ratio for the "1" context tree is equal to 1.000. The weighted compression ratio for the basis set {1,0}=(1/1)1.333+(0/1)1.000=1.333. Thereafter, a comparison of the compression ratios between the two basis sets, the null basis set having a compression ratio of 1.000 and the basis set {1,0} having a weighted compression ratio of 1.333, results in the null basis set being chosen for encoding the next string of bits.

Figure 9C:
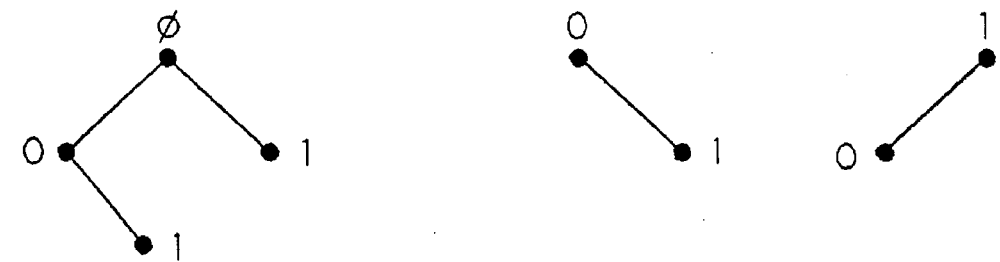

Next, the input string is again observed. In this instance, since the null context tree has previously encoded both a "0" and an "1," the "01" string within the input string is the next data string which has not been seen before. This input string will then be encoded using the null tree, which results in the growth of the null tree as indicated within FIG. 9c (step 43). The pointer and extension resulting from the null tree will be utilized within step 44 for encoding of the string "01". Thereafter, other trees having contexts compatible with the string "01" will also be extended. Thus, the "1" context tree will be extended as shown within FIG. 9c, since the first bit within the string "01" is a "0", which has a context of "1." The "0" context tree is not extended since its context is not compatible with the encoded string.

Thereafter, as indicated within step 47 above, the average depths of the trees are updated. In the case of the null tree, the average depth is computed as the pointer lengths for the extendable nodes within the tree divided by the number of extendable nodes, which is equal to 4/3=1.333. (The pointer length for the null tree is equal to 2 since two bits are required to distinguish between the extendable nodes within the tree.) Correspondingly, the "0" and "1" context trees have average depths of 0.500 and pointer lengths each equal to 1.

The compression ratio of the null tree is equal to 1.286 which is equal to the pointer length plus the "1" bit required to extend the tree, divided by the average depth plus "1" bit required to extend the tree, which is equal to (2+1)/(1.333+1)=1.286.

The weighted compression ratio of the basis set {0,1} is equal to (1/2)1.333+(1/2)1.333=1.333. As a result, the null basis set will again be chosen to compress the next string of bits since its compression ratio of 1.286 is less than the weighted compression ratio of basis set {0,1}, which is 1.333.

Figure 9D:
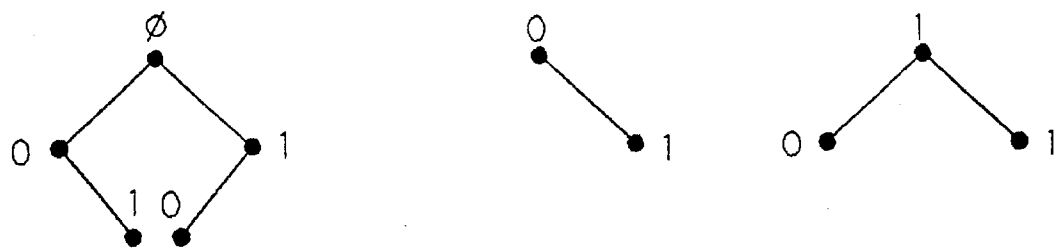

As a result, the input string is again observed for the next compression. The next string within the input, which has not been seen before, with respect to the null tree, is the string "10." Therefore, this string will next be encoded by the null basis set. As within step 43, the null tree is extended as illustrated within FIG. 9d, using the encoded string "10." Again, as indicated within step 44, the pointer and extension are computed to encode this string. Thereafter, the trees are extended as illustrated within FIG. 9d; note that the "1" context tree has been extended since the string "10" has a context of "1."

Again, the average depths (step 47) are computed. For the null tree, the average depth is equal to 6/4 which equals 1.500. The maximum pointer length required to distinguish between the extendable nodes is required to be equal to 2. Therefore, the compression ratio for the null tree is equal to (2+1)/(1.500+1)=1.200.

The average depth of the "0" context tree is equal to 0.500 with a pointer length of 1, and the average depth of the "1" context tree is equal to 1.000 with a pointer length of 1. The weighted compression ratio for the basis set {0,1} is equal to (1/3)1.333+(2/3)1.000=1.111. As a result, the basis set {0,1} is chosen.

Therefore, the basis set {0,1} will be used to encode the next data string. Thus, the input data string is observed for the next string of bits which has not been seen before with respect to the basis set {0,1}. As a result, the next string "0" will be encoded. As a result of using the basis set {0,1}, and since the next data string "0" has a context (D=1) of "0," the "0" tree will be extended as shown within FIG. 9e. Thereafter, all compatible trees are also to be extended. The "1" context tree will not be extended since it does not have a compatible context. However, the null tree may be extended. As noted within step 45 of FIG. 4, tokens are added to the root node of each LZ tree, in this case the null tree, which corresponds to the context compatible with the current context. Thereafter, as indicated within step 46, all tokens in all trees are then moved using the bits of the currently encoded phrase, in this case "0." As a result, a token is moved within the null tree as indicated by the circled node within FIG. 9e.

Thereafter, the average depths and pointer lengths and compression ratios, including weighted compression ratios, are computed as described above. The result, which is not repeated in this instance, results in the basis set {0,1} being chosen again (step 41) to encode the next phrase. This next phrase within the input string to be encoded, which has not been seen before with respect to the selected basis set, is the phrase "10." Since the phrase "10" has a context of "0," the "0" context tree is again used to encode the phrase. Please refer next to FIG. 9f, wherein the three trees are shown. Note that the "0" context tree has been extended as a result of the utilization of the tree to encode the phrase "10."

Figure 9E:
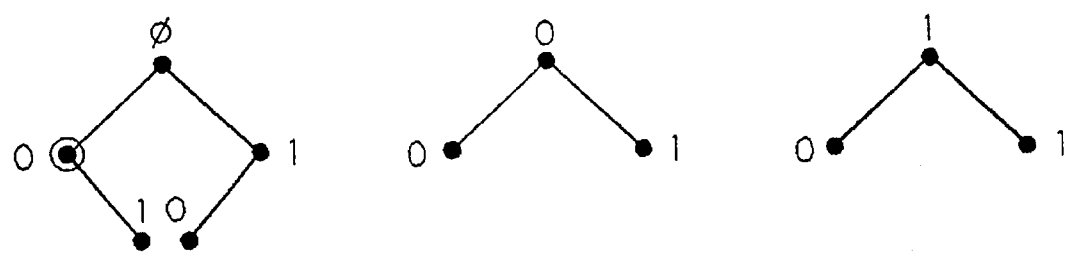
Figure 9F:
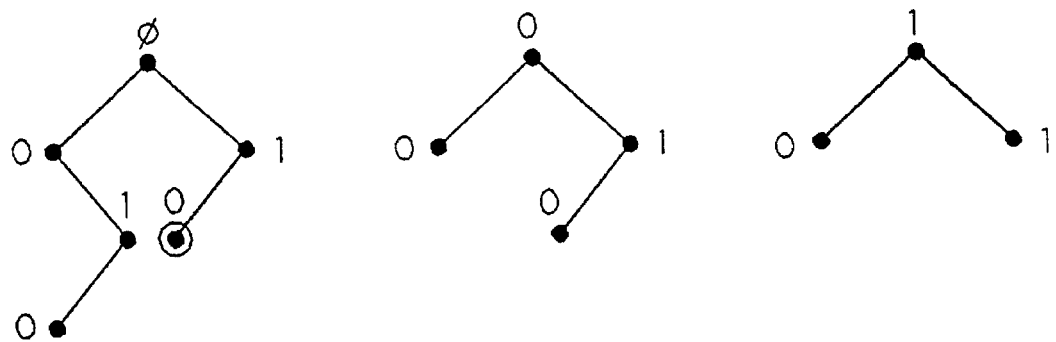

As directed within step 45, tokens are added to the root node of each LZ tree, which corresponds to the context compatible with the current context for phrase "10." As a result, a token is added to the root of the null tree. Note that the "1" context tree is again not extended since it does not contain a compatible context. As directed within step 46, all tokens within all trees are moved using the current encoded phrase. Since the null tree now includes 2 tokens (refer to FIG. 9e), each token will have to be moved. The tokens are moved in an order corresponding to when they were created. Thus, the token illustrated within FIG. 9e is moved first using the currently encoded phrase "10." As a result, the null tree is extended as illustrated in FIG. 9f. Since the token first created and illustrated within FIG. 9e has been moved to create a new leaf within the null tree, this token is now removed.

Next, the token beginning at the null node is moved using the phrase "10," resulting in a token being left within the null tree as indicated within FIG. 9f. Note that this token is not removed since it has not been moved to create a new leaf within the null tree.

Thereafter, the average depths of the three trees are computed. The average depth of the null tree is computed to be equal to 9/5=1.800 with a pointer length of 3. Therefore, the compression ratio of the null tree is equal to (3+1)/(1.8+1)=1.429. The weighted compression ratio of the basis set {0,1} is equal to (3/5)1.286+(2/5)1.000=1.172. (Note that the computed average depths of the "0" and "1" context trees were 1.333 and 1.000, respectively, and their pointer lengths were equal to 2 and 1, respectively, resulting in unweighted compression ratios for the two trees of 1.286 and 1.000, respectively.) As a result, the basis set {0,1} will be chosen again to encode the next phrase since its weighted compression ratio is less than the compression ratio of the null basis set. The remainder of the encoding process will not be described hereinafter, but follows the same procedure as described above.

Process 3: Compound Phrase Tree

In the previous Process 2, separate trees were maintained for each possible state or context of length less than D. But there is considerable overlap in the information in the different trees. Therefore, a preferred embodiment is to combine the information into a single tree. The basis of Process 3 hereinafter described is to combine all the information into a single tree. Thus, Process 3 uses subtrees of a single tree instead of the multiple trees of Process 2.

Process 3 is motivated by the following observation: Consider the standard LZ tree, and consider the subtree rooted at the node at depth 1 marked "0". All nodes in the subtree correspond to phrases in the encoding that started with a "0". Thus if these phrases are considered with the first bit "0" removed, these are substrings of the sequence that have context "0". Therefore, the subtree of the LZ tree starting at "0" corresponds to a set of substrings of the sequence that have context "0". Thus, subtrees of a single tree can be used to represent substrings with the same context.

Within Process 3, a single tree T is maintained. The dictionary associated with each d context h is subtree $T_h$ reached via h from the root of T. If h is chosen as the context, then (a) the identity of the appropriate leaf in $T_h$ is transmitted and an LZ extension performed to this subtree, (b) phrases are started for each compatible d-context, $d \leq D$. The tokens associated with the new phrases are in order of increasing context length (i.e. empty context first).

Figure 5:
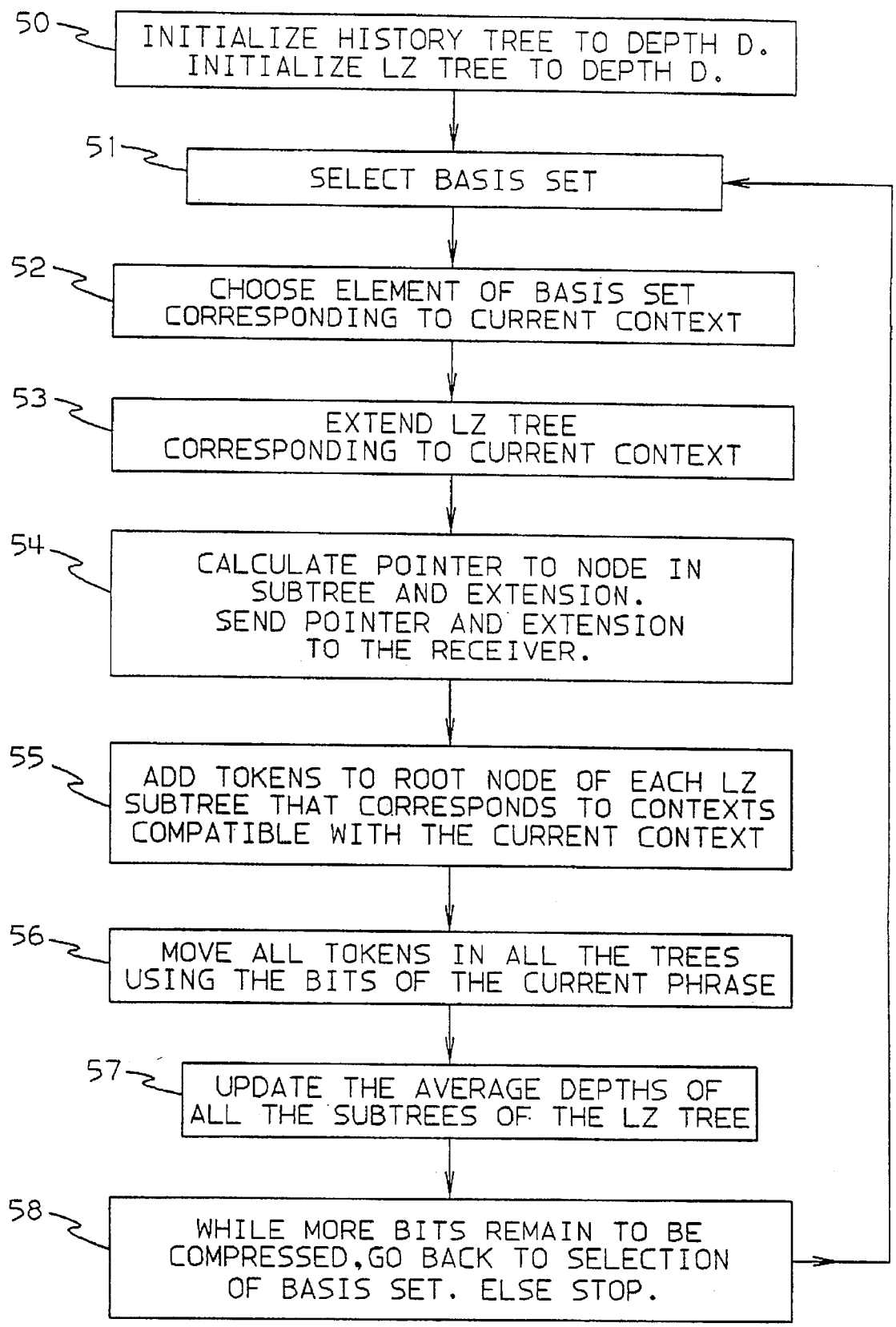
FIG. 5 illustrates a flow diagram of a preferred embodiment of the present invention.

Referring next to FIG. 5, there is illustrated a flow diagram of an implementation of Process 3 in accordance with the present invention. Process 3 begins at step 50, wherein the history tree and the LZ tree are initialized to depth D. Thereafter, at step 51, the basis set utilized for the compression is selected in the manner described above. Next, at step 52, the element within the basis set corresponding to the current context is chosen for compression. Next, at step 53, the LZ subtree corresponding to the current context is extended utilizing the current phrase being compressed, or encoded.

Next, at step 54, the pointer corresponding to the extension for the chosen LZ subtree and its extension are calculated. This pointer and its extension are also sent to the receiver (i.e., the current phrase is encoded with the pointer and the extension). Next, at step 55, tokens are added to the root node of each LZ subtree corresponding to histories compatible with the current context corresponding to the phrase that is encoded.

Next, at step 56, all tokens on the tree are moved using the information of the current phrase being compressed. Thereafter, at step 57, the average depths of all LZ subtrees are updated, and, lastly, at step 58, if more information remains to be compressed, Process 3 returns to step 51; otherwise, Process 3 ends.

Some properties of Process 3 are worth noting. The tree T grows faster than in Process 1. However, the growth here is accomplished somewhat differently in that D+1 nodes are eventually (upon token promotion) added for each phrase, rather than one node for each new bit. As phrases eventually grow to be much longer than D, the rate of growth of T decreases.

Second, Process 3 conforms to the theorem noted above, so it is asymptotically optimal. The property of storing D+1 nodes for each phrase is like that of Process 2. However, each added node appears in D+1 context subtrees, so that the effect is analogous to adding $(D+1)^2$ nodes for separate trees. This suggests that this variant should yield better performance for short files, as is shown by experiment.

Figure 10A:
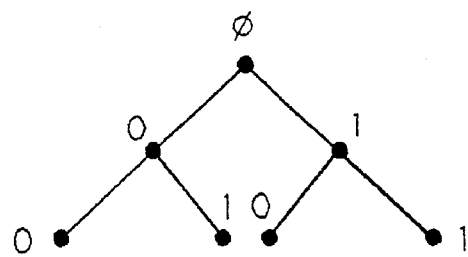
FIGS. 10a–d illustrate growth of a context-dependent dictionary in accordance with Process 3 of the present invention.

Referring next to FIG. 10a, there is shown an initialized history tree to depth D=2 (step 50). To illustrate the working of Process 3, consider the same sample input string that was used as an example for Process 2. In this case, consider the case when D=2. In Process 3, there is only one tree, which is initialized to be a complete tree of depth D (step 50 in FIG. 5). Thus the process starts with a complete tree of depth 2, as shown in FIG. 10a. The basis set is also initialized to the default value, i.e., the null basis set (step 51). Thus the element of the basis set that corresponds to the current context is the null context.

Figure 10B:
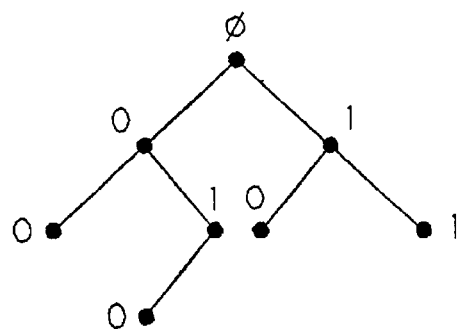

The subtree corresponding to the null context is the subtree rooted at the root of the LZ tree, i.e., the complete LZ tree. Therefore, the process adds a token to the root of the LZ tree and use the input bits to push the token down the tree. The first two bits are 01, which brings the token to a leaf of the tree, and the next bit is a 0, which then corresponds to a phrase that has not been set before. Therefore, the node corresponding to this bit is added to the tree, giving the tree shown in FIG. 10b. Since there are no preceding bits before this phrase, there are no other compatible contexts, and therefore no other tokens added to the tree.

At this point, the average depths of all the subtrees of the tree are calculated. For the subtree starting at the root, i.e., the complete tree, there are 4 possible nodes that can be extended at depth 2 and one possible node at depth 3, giving an average depth of 2.2. The length of the pointer to distinguish one of these nodes is 3 bits, and therefore the compression ratio for this subtree is (3+1)/(2.2+1)=1.25.

Now consider the subtree rooted at "0". This subtree has three possible nodes that could be extended, two at depth 1, and one at depth 2. Therefore the average depth of the extensible nodes for the subtree is 4/3=1.333. The length of pointer required for this subtree (to distinguish between these 3 nodes) is 2 bits. Therefore, the compression ratio for this subtree is (2+1)(1.3333+1)=1.286.

Similarly, the average depth for the subtree rooted at "1" is 1, the pointer length is 1 bit, and the compression ratio for this subtree is (1+1)/(1+1)=1.000.

The compression ratios for the subtrees rooted at "00" is calculated as 1.000, for "01" as 1.333, for "10" as 1.000, and for "11" as 1.000. These are the compression ratios for the corresponding nodes in the history tree. Note that the history node "01" is the child of the history node "1", not of the history node "0".

Now, the process performs the dynamic programming to find the basis set that minimizes the compression ratio. At each stage of the dynamic programming procedure, a comparison is made of the compression ratio of a node in the history tree with the average of the compression ratios of the children of this node. The compression ratios of the children are weighted by the number of nodes in their respective subtrees, in a fashion similar to the weighting in Process 2.

This dynamic programming algorithm is started at the maximum depth nodes in the history. In this case, D=2, and the maximum depth nodes are at depth 2. Thus, the algorithm compares the compression of history node "0" with the compression of its children, which are the nodes "00" and "10". In this case, each of the child nodes has only one node in its subtree and has compression ratio 1.000. Thus the average compression ratio of the children is 1.000. The compression ratio of node "0" is 1.286, as calculated above. Since compression ratio of node "0" is less than the average compression ratio of its children, the algorithm chooses the children to be members of the basis set.

The algorithm then compares the compression ratio of node "1" with the average compression ratio of its children, which are nodes "10" and "11". The subtrees corresponding to the children have 2 and 1 node respectively, and therefore the average compression ratio of the children is (2/3)1.333+(1/3)1.000=1.222. Since this is more than the compression ratio of history node "1", the algorithm chooses node 1 to be a member of the basis set instead of nodes 01 and "11".

Finally, the algorithm compares the compression ratio for the null history with the best compression ratio for the basis set chosen so far. There are 1,1, and 3 nodes respectively in the subtrees rooted corresponding to histories "00", "10" and "1". The average compression ratio for this basis set is (1/5)1.000+(1/5)1.000+(3/5)1.000=1.000. Since this compression ratio is better than the compression ratio for the null context (1.250, as calculated above), the algorithm chooses as the basis set the set "00, 10, 1".

Now the algorithm looks at the preceding bits and finds the element of the basis that corresponds to the current context. Since the preceding bits were 010, the compatible member of the current basis set is 10. Thus the subtree corresponding to 10 is the subtree that will be used to compress the next phrase.

Figure 10C:
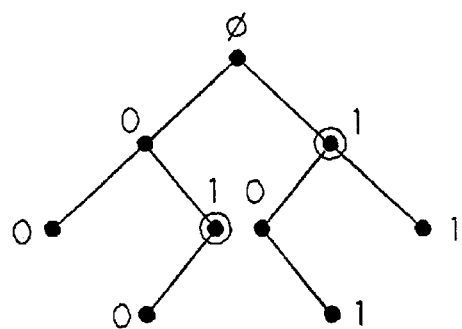

In step 54, the process now starts with the subtree rooted at "10". The next input bit is a 1, and the node corresponding to this 1 does not exist in the tree. The process therefore adds this node, creating a new tree, as shown in FIG. 10c. The compression routine then sends a pointer to the parent node in the subtree, and the extension symbol (step 55).

In step 56, the process adds tokens to the roots of all subtrees corresponding to histories compatible with the current context. In this case, the compatible histories ar the null history and the history "0". Thus tokens are added to the root of the LZ tree and the node corresponding to the history "0", i.e., the node 0. In step 57, these tokens are moved using the bits of the current phrase. Since the current phrase is just 1, this moves the token that started at the root to the node "1", and the token that started at "0" to the node "01". The state of the tree and the tokens at the end of step 57 is shown in FIG. 10c.

At the next step (step 58), the average depths and compression ratios are again calculated for every node in the history tree. In this case, the compression ratios are 1.200 for the null context 1.286 for "0" and for the "1" context, 1.000 for the "00" and the "11" context, and 1.333 for the "01" and "10" contexts.

Since there are more input bits remaining, the process goes back to step 51 in FIG. 5. Performing the dynamic programming algorithm as before, the process ultimately chooses the null basis as the best basis set for the compression of the next phrase. The algorithm then starts from the root of the LZ tree, and using the next few bits goes down the tree. The next three bits are 100, which leads to new node. This node is added to the tree, and a pointer to this node and an extension are sent to the receiver.

Figure 10D:
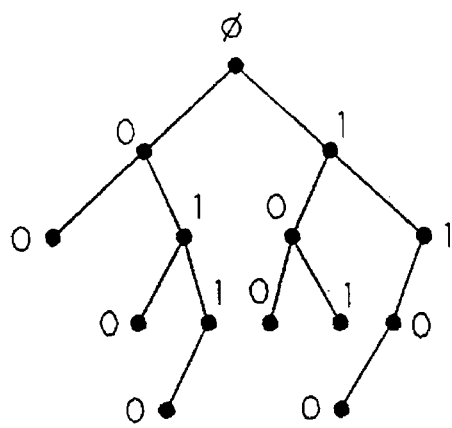

The compatible contexts in this case are the contexts "1" and "01". Tokens are added at the nodes that correspond to these contexts. Then all the tokens are moved using the bits of the current phrase, earliest tokens first. The first token moved is therefore the token marked 0 in FIG. 10c. This token is moved using 10, forming a new node (the 110 node in the LZ tree). The next token moved is the token marked 1 in FIG. 10c. This token is moved using the first bit of the current phrase (i.e., 1) and forms a new node (the 011 node of the LZ tree). Then the new token added during this phrase are moved. The next token to be moved is the one added to the node corresponding to context "1". This token moves down to 1100, forming a new node. Note that this token moves over a new node just creating by the promotion of an earlier token. To ensure consistency, it is important to have a fixed order for the movement of tokens. Finally, the token added to the node "01" is moved, forming a new node at 0110. Thus at the end of this phrase, all the current and earlier tokens have been promoted to phrases, and the tree is as illustrated in FIG. 10d.

Figure 10E:
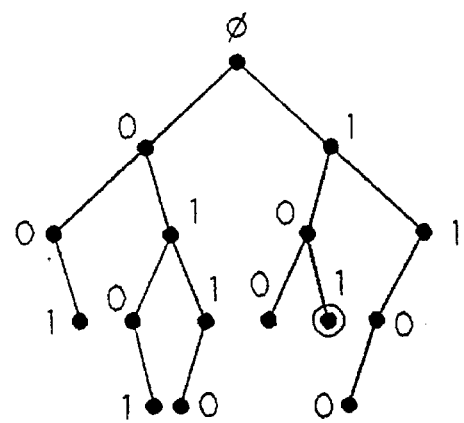

This process is repeated as required to encode the remaining bits of the sequence. The tree at the end of the next phrase is illustrated in FIG. 10e. The process is not described in detail, but follows the same procedure until the end of the input sequence.

Process 4: Single Tree With Context Allocation

Process 4, another alternative embodiment of the present invention, is essentially a standard LZ tree that makes use of context dependence. At each time t, transmitter and receiver have common knowledge of the sequence $X_1, X_2, \ldots, X_{n(t)}$. Each constructs an LZ tree, as in Process 1, except that at time t, there may be an uncompleted LZ phrase, which is represented by a token. At the start of each phrase, the allocation function $R_t$ selects a subtree to be used for transmission, and a pointer is sent to the leaf of this subtree, plus an extension. However, this new phrase is not added to the tree. Instead, it simply advances common knowledge of the sequence to some point.

Figure 6:
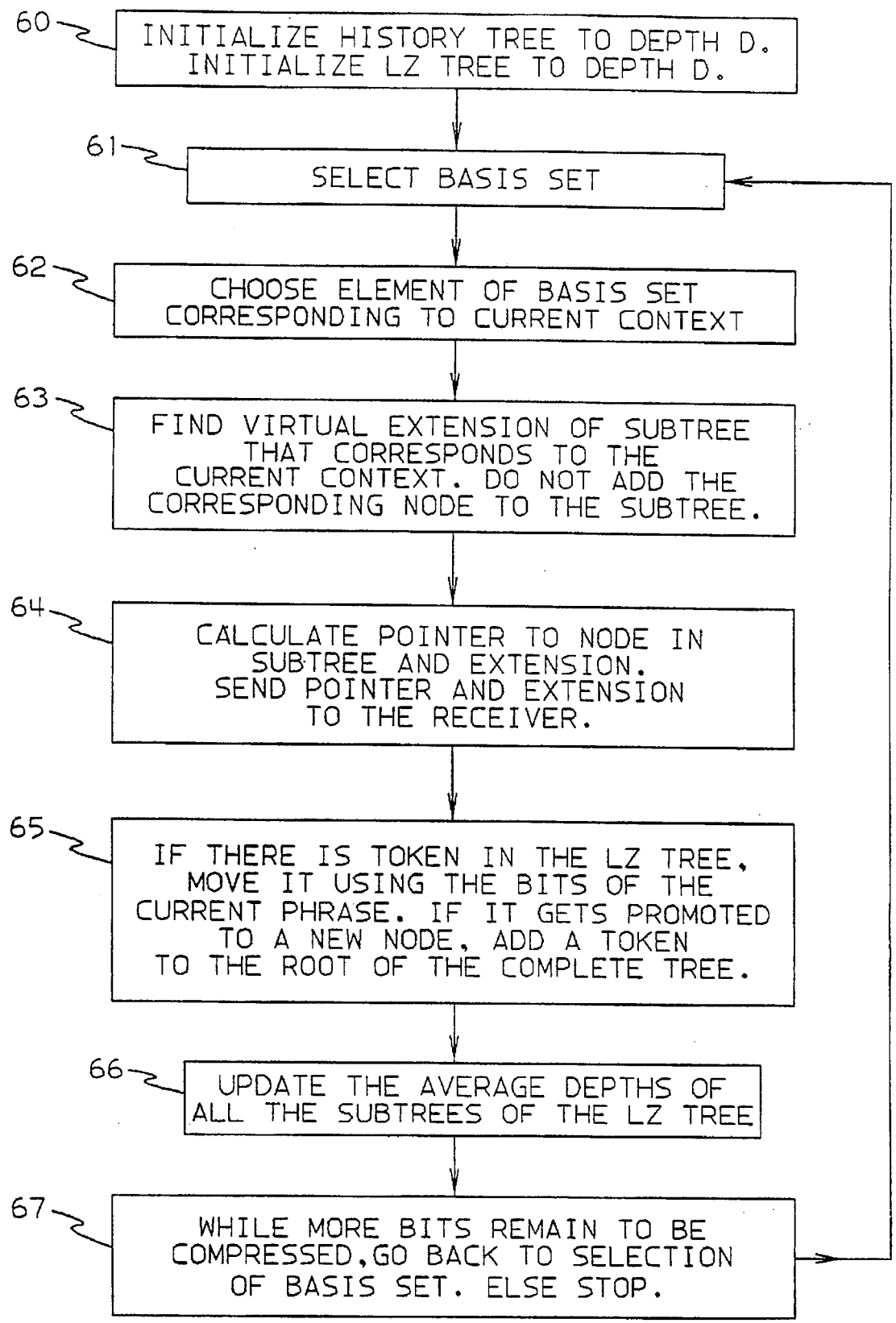
FIG. 6 illustrates a flow diagram of an alternative embodiment of the present invention.

Referring next to FIG. 6, there is illustrated a flow diagram of an implementation of Process 4 in accordance with the present invention. First, at step 60, the history tree and the LZ tree utilized within the compression process are both initialized to depth D. Thereafter, at step 61, the basis set utilized for the compression is selected as described above.

Next, at step 62, the element within the chosen basis set corresponding to the current context associated with the current phrase to be encoded is selected. Next, at step 63, the virtual extension of the subtree that corresponds to the current context is determined. However, the corresponding node, or new phrase, is not added to the subtree.

Thereafter, at step 64, the pointer to the node in the subtree and its extension are calculated and sent to the decoder. Next, at step 65, if there is a token in the LZ tree, it is moved using the information of the current phrase. If the token becomes promoted to a new node, a token is then added to the roots of the complete tree. Thereafter, in step 66, the average depths of all the subtrees of the LZ tree are updated for later use. And, lastly, at step 67, Process 4 ends unless more information remains to be compressed, wherein Process 4 returns to step 61. Some properties of Process 4 might be mentioned. Theorem 2 does not apply here, since phrases are not extended and added directly to the tree or subtrees, so that the same phrase might be used multiple times with the source subtree. At the start of each phrase, the estimated compression resulting from a basis set is compared (in a procedure to calculate the allocation function $R_t$) with that from using the entire tree, and subtrees are used only if an advantage is perceived. That is, there is always an option to return to standard LZ. This suggests a possible modification: Both sender and receiver could agree to switch to standard LZ if they find that standard LZ is doing better.

Experimental results, however, indicate that Process 4 outperforms standard LZ, with performance similar to that of Process 2. It might be conjectured that this is due to the fact that each new LZ phrase adds a node to D+1 context subtrees.

Implementation Within Data Processing System

Figure 7:
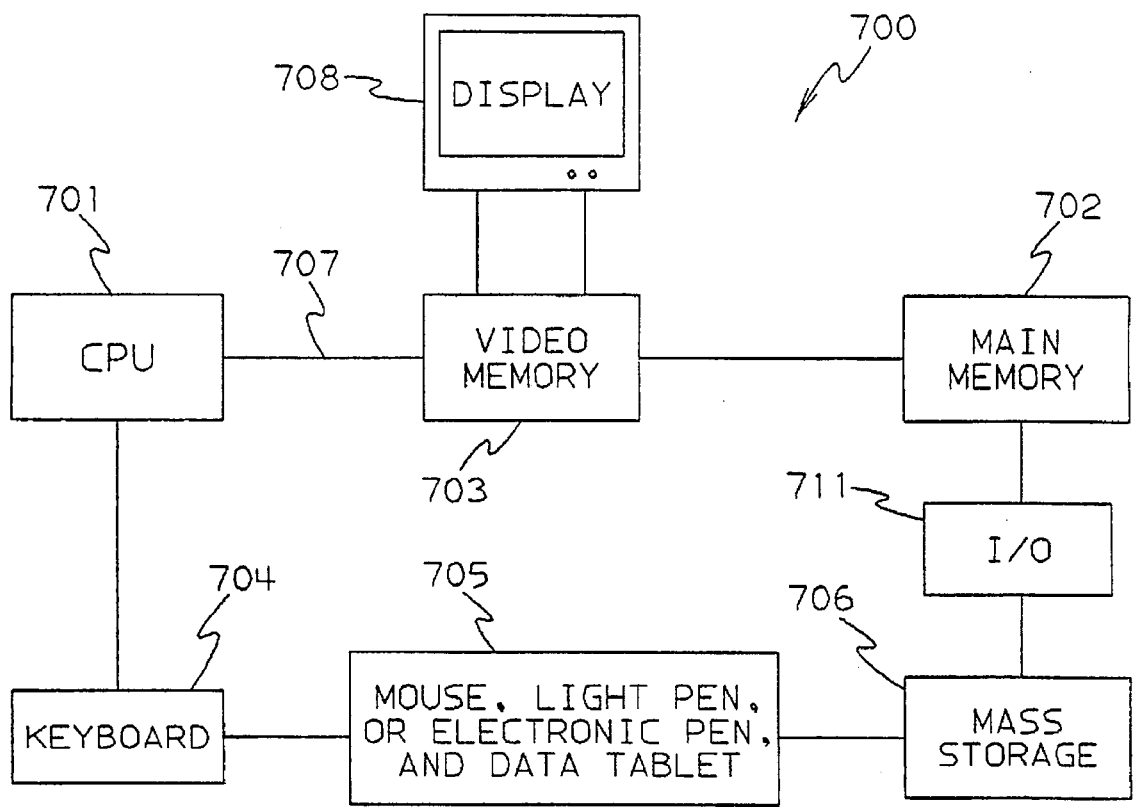
FIG. 7 illustrates a data processing system for implementing the present invention.

Referring next to FIG. 7, there is illustrated hardware system 700 for implementing the present invention as part of a data processing system. System 700 includes CPU 701, main memory 702, video memory 703, keyboard 704 for user input, supplemented by conventional mouse (or light pen, electronic pen and data tablet, etc.) 705, and mass storage 706, which may include both fixed and removable media using any one or more of magnetic, optical or magneto-optical storage technology or any other available mass storage technology.

These components are interconnected via conventional bidirectional system bus 707. Bus 707 contains address lines for addressing any portion of memory 702 and 703. System bus 707 also includes a data bus for transferring data between and among CPU 701, main memory 702, video memory 703, mass storage 706 and input/output (I/O) port 711.

In a preferred embodiment of system 700, CPU 701 may be any suitable microprocessor or microcomputer. I/O port 711 enables system 700 to have access to the "outside world" (e.g., external systems and processes).

Main memory 702 of system 700 is a conventional dynamic random access memory of a suitable size. Video memory 703 is a conventional dual-ported video random access memory, which may include frame buffers, which hold the contents of a single screen image. Video memory 703 provides video data for display upon display 708, which in a preferred embodiment of the present invention is a cathode-ray tube (CRT) raster display monitor. However, display 708 may be a liquid-crystal, cold-cathode, or any other pixel-based display.

The various processes of the present invention may be stored within mass storage 706 or main memory 702, or incorporated through I/O 711 for subsequent use by CPU 701. The data to be compressed may also be stored in mass storage 706 or may be obtained through I/O 711 for manipulation by CPU 701 through the use of the present invention. For example, data to be stored within mass storage 706, or transferred to an outside system via I/O 711, may be compressed by the present invention, which is implemented within CPU 701. Alternatively, compressed data may be received by system 700 through I/O 711 for decompression, utilizing the present invention within CPU 701.

Figure 8:
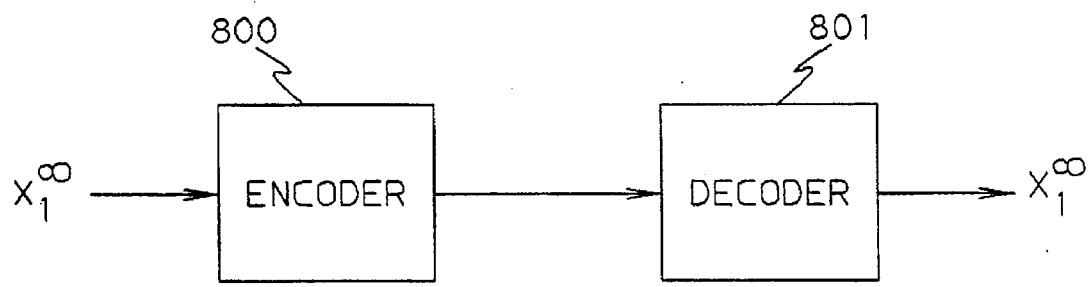
FIG. 8 illustrates a block diagram of an implementation of the present invention.

Referring next to FIG. 8, there is illustrated a representative diagram of the process in accordance with the present invention. Essentially, a data sequence $x_1^\infty$ to be compressed is received by encoder 800. Encoder 800 utilizes any one of the compression techniques discussed above to compress the sequence $x_1^\infty$ for storage or transfer as described with respect to FIG. 7. Decoder 801 performs the process of decompression of the encoded sequence. As described above, decoder 801 incorporates and develops the same trees, or dictionaries, developed by encoder 800, so that decoder 801 may properly decompress the encoded sequence without loss of data. Encoder 800 and/or decoder 801 are implemented within CPU 701.

Although the present invention and its advantages have been described in detail, it should be understood that various changes, substitutions and alterations can be made herein without departing from the spirit and scope of the invention as defined by the appended claims.

What is claimed is:

1. In a data processing system, a method for compressing data, said method comprising the steps of:
   maintaining a plurality of dictionaries of encoded phrases for use in compression wherein each of said dictionaries correspond to a particular context;
   selecting a subset from said plurality of dictionaries such that for each context encountered there is a corresponding dictionary in said subset; and
   using said corresponding dictionary within said subset to encode, the next phrase.

2. The method as recited in claim 1, wherein said selecting step further comprises the step of:
   comparing compression efficiencies of subsets of said dictionaries with respect to previously encoded phrases.

3. The method as recited in claim 1, further including the step of decompressing data previously compressed by said method for compressing data, wherein said previously compressed data is comprised of pointer data which refers to phrases included within said plurality of context dependent dictionaries formed during said method, and wherein each of said dictionaries is associated with a history of said previously compressed data, said method further comprising the steps of:
   decoding said compressed data by utilizing said pointer data to refer to corresponding phrases within said plurality of context dependent dictionaries; and
   combining said referred phrases to form said data.

4. The method, as recited in claim 1, further including the step of using a context of a phrase which is some number of immediately preceding characters.

5. In a data processing system, a method for compressing data, said method comprising the steps of:
   developing and storing dictionaries of encoded phrases as a function of histories associated with each of said encoded phrases;
   selecting a subset of said dictionaries that is determined to statistically provide the highest potential compression;
   using a particular history within said subset to encode said next phrase, wherein said particular history corresponds to a history of said next phrase; and wherein said selecting step further comprises the steps of:
   (a) computing an average depth of each of said dictionaries;
   (b) computing a longest length of a phrase pointer possible within each of said dictionaries; and
   (c) computing a ratio of (b) to (a) to derive a potential compression ratio for each of said dictionaries.

6. In a data processing system, a method for compressing data, said method comprising the steps of:
   developing and storing dictionaries of encoded phrases as a function of histories associated with each of said encoded phrases;
   selecting a subset of said dictionaries that is determined to statistically provide the highest potential compression;
   using a particular history within said subset to encode said next phrase, wherein said particular history corresponds to a history of said next phrase;
   selecting a phrase from a dictionary within said selected subset in order to compress said next phrase;
   computing a pointer corresponding to said selected phrase;
   adding tokens to roots of each tree including said particular history; and
   moving tokens in all trees as a function of a symbol(s) contained within said next phrase.

7. A system for compressing data, said system comprising:
   means for developing and storing a plurality of context dependent dictionaries of encoded phrases as a function of histories associated with each of said encoded phrases; and
   means for selecting a subset of said dictionaries corresponding to a tree that is determined to statistically provide the highest potential compression; and
   means for using a particular history within said subset to encode said next phrase, wherein said particular history corresponds to a history of said next phrase.

8. The system as recited in claim 7, wherein said plurality of context dependent dictionaries are subtrees of a single tree.

9. The system, as recited in claim 8, wherein said context dependent dictionaries are subtrees obtained by following a path from the root of said single tree consisting of branches corresponding to characters of a context.

10. The system as recited in claim 7, further including means for decompressing data previously compressed by said system for compressing data, wherein said previously compressed data is comprised of pointer data which refers to phrases included within said plurality of context dependent dictionaries formed by said system, and wherein each of said dictionaries is associated with a history of said previously compressed data, said system further comprising:

means for decoding said compressed data by utilizing said pointer data to refer to corresponding phrases within said plurality of context dependent dictionaries; and means for combining said referred phrases to form said data.

11. In a data processing system, a method for predicting a next sequence of unknown symbol(s) within a stream of symbols observed over a period of time, said method comprising the steps of:

developing dictionaries of previously observed symbols, wherein more than one of said dictionaries is context dependent;

determining which of a plurality of subsets of said dictionaries would statistically provide a most accurate compressor of said next sequence of symbol(s);

selecting a dictionary within said determined subset for calculating a probability distribution of the next sequence of symbol(s); and using said probability distribution for predicting the next symbol.

12. A system for predicting a next sequence of unknown symbol(s) within a stream of symbols observed over a period of time, said system comprising:

means for developing dictionaries of previously observed symbols, wherein more than one of said dictionaries is context dependent;

means for determining which of a plurality of subsets of said dictionaries would statistically provide a most accurate compressor of said next sequence of symbol (s);

means for selecting a dictionary within said determined subset for calculating a probability distribution of the next sequence of symbol(s); and means for using said probability distribution for predicting the next symbol.

13. A computer program product comprising:

a program storage device readable by a computer system tangibly embodying a program of instructions executable by said computer system to perform a method for compressing data, said method comprising the steps of:

developing and storing a plurality of context dependent dictionaries of encoded phrases as a function of histories associated with each of said encoded phrases;

selecting a subset of said dictionaries corresponding to a tree that is determined to statistically provide the highest potential compression; and using a particular history within said subset to encode said next phrase wherein said particular history corresponds to a history of said next phrase.

14. The computer program product as recited in claim 13, wherein said selecting step further comprises the step of:

comparing compression efficiencies of subsets of said dictionaries with respect to previously encoded phrases.

15. The computer program product as recited in claim 13, wherein said selecting step further comprises the steps of:

(a) computing an average depth of each of said dictionaries;

(b) computing a longest length of a phrase pointer possible within each of said dictionaries; and (c) computing a ratio of (b) to (a) to derive a potential compression ratio for each of said dictionaries.

16. The computer program product as recited in claim 13, wherein said method further comprises the steps of:

electing a phrase within said selected subset in order to compress said next phrase;

computing a pointer corresponding to said elected phrase;

adding tokens to roots of each tree including said particular history; and moving tokens in all trees as a function of a symbol(s) contained within said next phrase.

17. The computer program product as recited in claim 13, wherein said method further includes the step of decompressing data previously compressed by said method, wherein said previously compressed data is comprised of pointer data which refers to phrases included within said plurality of context dependent dictionaries formed during said method, and wherein each of said dictionaries is associated with a history of said previously compressed data, said method further comprising the steps of:

decoding said compressed data by utilizing said pointer data to refer to corresponding phrases within said plurality of context dependent dictionaries; and combining said referred phrases to form said data.

* * * * *